(12) United States Patent
Cooke et al.

(10) Patent No.: US 7,713,377 B2
(45) Date of Patent: May 11, 2010

(54) APPARATUS AND METHOD FOR PLASMA TREATING A SUBSTRATE

(75) Inventors: Michael Joseph Cooke, Bristol (GB); Geoffrey Hassall, Exeter (GB)

(73) Assignee: Oxford Instruments Plasma Technology Limited, Oxford (GB)

( * ) Notice: Subject to any disclaimer, the term of this patent is extended or adjusted under 35 U.S.C. 154(b) by 462 days.

(21) Appl. No.: 10/574,187

(22) PCT Filed: Sep. 30, 2004

(86) PCT No.: PCT/GB2004/004158

§ 371 (c)(1),
(2), (4) Date: Feb. 21, 2007

(87) PCT Pub. No.: WO2005/034163

PCT Pub. Date: Apr. 14, 2005

(65) Prior Publication Data

US 2007/0158305 A1    Jul. 12, 2007

(30) Foreign Application Priority Data

Oct. 1, 2003    (GB) ................................. 0323001.8

(51) Int. Cl.
*C23F 1/00* (2006.01)
(52) U.S. Cl. .............................. 156/345.3; 156/345.33; 156/345.4; 438/716
(58) Field of Classification Search .............. 156/345.3, 156/33, 34, 37, 345.4; 438/706, 710, 7, 716
See application file for complete search history.

(56) References Cited

U.S. PATENT DOCUMENTS

| 5,891,348 | A | | 4/1999 | Ye et al. |
| 5,962,083 | A | * | 10/1999 | Hatanaka et al. ............ 427/571 |
| 6,059,985 | A | * | 5/2000 | Yoshimura et al. ............ 216/37 |
| 6,257,168 | B1 | * | 7/2001 | Ni et al. .................. 118/723 R |
| 6,511,577 | B1 | * | 1/2003 | Johnson ................. 156/345.48 |
| 6,635,185 | B2 | * | 10/2003 | Demmin et al. ............... 216/64 |
| 2002/0121501 | A1 | * | 9/2002 | Choquette et al. ............ 216/67 |
| 2003/0082920 | A1 | * | 5/2003 | Huang et al. ................ 438/710 |
| 2003/0201069 | A1 | * | 10/2003 | Johnson ................. 156/345.43 |

FOREIGN PATENT DOCUMENTS

EP    0676790 A1    11/1995
WO    02056333    7/2002

OTHER PUBLICATIONS

PCT Search Report dated Sep. 14, 2005 of Patent Application No. PCT/GB2004/004158 filed Sep. 30, 2004.

* cited by examiner

*Primary Examiner*—Lan Vinh
(74) *Attorney, Agent, or Firm*—Vern Maine & Associates

(57) ABSTRACT

Apparatus is provided for plasma treating a substrate. This has a chamber (2) and a plasma generator (4) which forms a plasma from one or more gases flowing within the chamber so as to produce one or more species for interacting with a substrate (8) placed within the chamber. A guide (12) is provided for directing the gas flow containing the species towards the substrate (8). When in use, the width of the plasma is greater than that of the substrate by an amount defining an outer region of plasma. The guide is adapted to direct the species from at least substantially all of the outer region of the plasma towards the substrate. A corresponding method of plasma treatment is also disclosed.

34 Claims, 6 Drawing Sheets

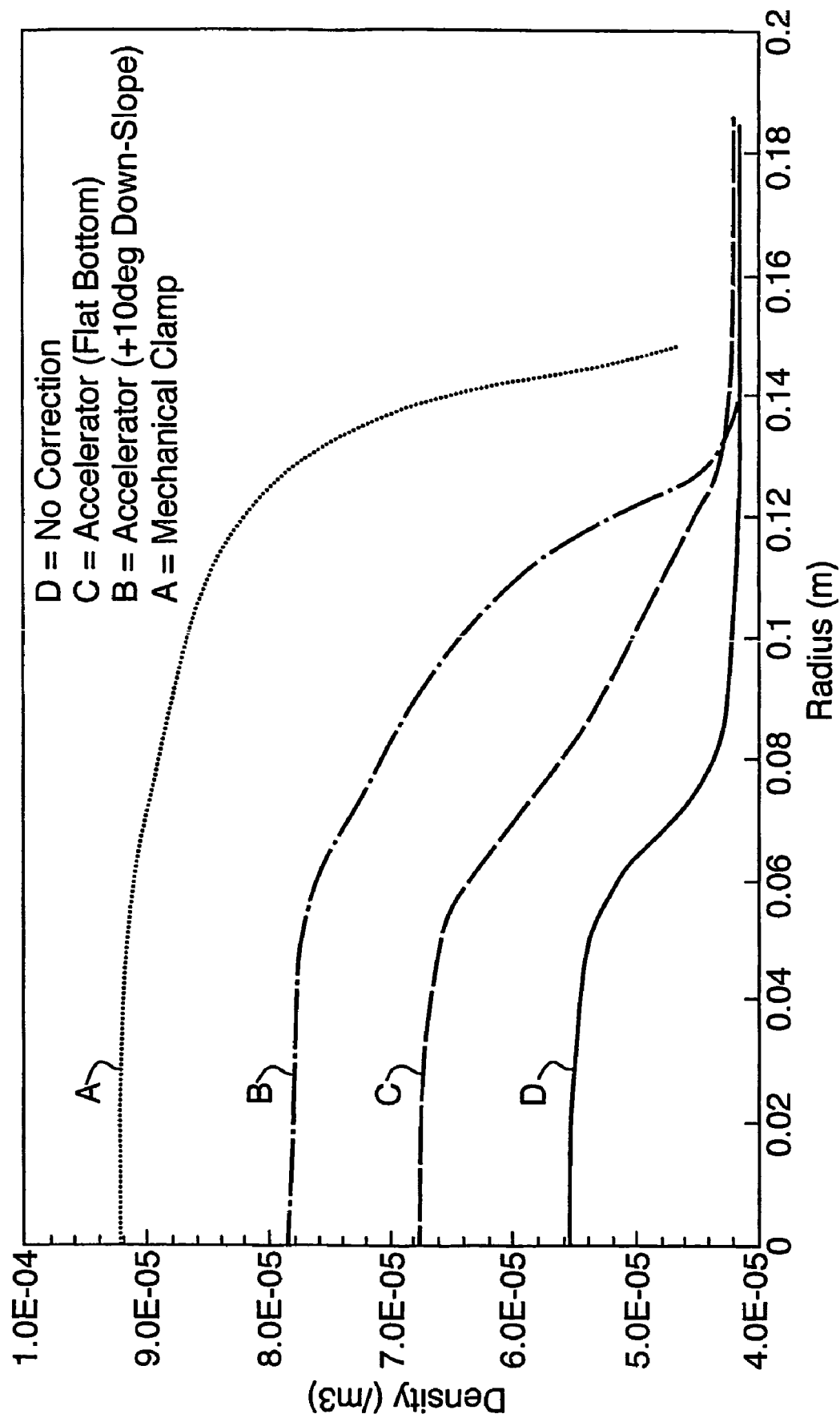

APPARATUS AND METHOD FOR PLASMA TREATING A SUBSTRATE

CROSS REFERENCE TO RELATED APPLICATIONS

This application claims is a national stage application of Patent Cooperation Treaty No. PCT/GB2004/004158 filed Sep. 30, 2004, published as WO2005/034163. In addition, this application claims priority to GB Application No. 0323001.8, filed Oct. 1, 2003. Each of these applications is herein incorporated in its entirety by reference.

FIELD OF THE INVENTION

The present invention relates to an apparatus and method for plasma treating a substrate.

Plasma treatment systems of various designs are known for performing treatments such as the etching of substrates or the deposition of thin layers upon substrates. This is achieved by the formation of plasmas within low pressure gases.

The maximum etch/deposition rates achievable are of particular practical importance and various apparatus and process parameters are modified to control these rates. Such parameters include the size of the reaction chamber, the choice of precursor gases, the plasma power, the gas flow rate, the gas pressure and the electrical potential bias applied to the substrate.

One such prior art system is disclosed in WO02/056333 in which a plasma is generated within a relatively narrow upper sub-chamber using RF coils. The active species produced then migrate into a larger lower chamber beneath, within which a target substrate is positioned.

Remote or downstream plasma sources are also known in which gaseous species are ionised and excited at a location which is distant from the workpiece. Typically the excitation occurs within a pipe or duct and the active species flow along the pipe to then interact with the workpiece. In order to treat a large workpiece such a pipe is arranged to open into a larger chamber accommodating the workpiece.

In some prior art systems (such as that disclosed in WO02/056333), an expansion region is provided by the provision of a large chamber adjacent the plasma generation region. Such an expansion chamber provides for the homogenisation of the species generated within the plasma. Whilst this has some positive effects with regard to the uniformity of the treatment upon the substrate surface, it is often detrimental to the treatment rate, adds to the cost of the equipment and complicates the set-up procedure associated with the apparatus.

There is therefore an ongoing desire within the industry to provide improved apparatus with higher process rates whilst maintaining the uniformity of the treatment effect upon the substrate.

SUMMARY OF THE INVENTION

In accordance with a first aspect of the present invention we provide an apparatus for plasma treating a substrate comprising:— a chamber within which one or more gases are caused to flow;

a plasma generator for causing the gas(es) within the chamber to form a plasma, thereby generating at least one species; and a guide for directing the gas flow containing the species towards the substrate;

wherein the apparatus is arranged such that the width of the plasma in use is greater than that of the substrate, the difference between the widths defining an outer region of plasma, and wherein the guide is adapted to direct species from substantially all of the outer region, towards the substrate.

In addition, in accordance with a second aspect of the present invention we also provide a method for plasma treating a substrate comprising:

causing one or more gases to flow within a chamber;

forming a plasma from the gas(es) within the chamber using a plasma generator, thereby generating at least one species; and directing the gas flow containing the species towards the substrate;

wherein the width of the plasma in use is greater than that of the substrate, the difference between the widths defining an outer region of plasma, and wherein the species are directed from substantially all of the outer region, towards the substrate.

We have realised that, in contrast to prior art systems, improved process rates can be achieved by the use of a guide for directing the gas flow within the apparatus onto the substrate and thereby directing the species produced within the plasma onto the substrate. Whilst in the past plasma treatment rates have relied upon diffusion and low velocity mass transport effects, the present invention recognises that a directed flow of species onto the substrate can produce much higher etch rates but without a corresponding detrimental effect upon the uniformity of the resulting substrate treatment.

One embodiment of the present invention differs from known systems in that such systems involve an expansion of the cross sectional area of the flowing gas to treat larger substrates. With one embodiment of the invention, the reverse in true. Indeed the increase in processing rate obtained with the invention is due to a concentration of species from a larger diameter into a smaller diameter. A further distinction can also be made in that, according to one embodiment, the plasma source of the invention is arranged in close proximity with the workpiece. It is required to be no more remotely positioned than the physical separation caused by the existence of the guide.

It is noted here that "focus rings" are known in the prior art (see for example U.S. Pat. No. 5,891,348 and EP-A-0676790). These should not be confused with the guide of the present invention. A focus ring is provided to improve uniformity of the substrate processing whereas the guide of the present invention has a function which increases the processing rate. We have realised that an appropriately designed plasma source and guide can substantially increase the processing rate by guiding and concentrating reactive species from a larger generation zone into a smaller consumption zone.

The effect of the focus ring in U.S. Pat. No. 5,891,348 for example, is to focus only a small part of the total gas flow onto the substrate. This focus ring acts mostly on the fresh gas supply, which flows straight down the chamber to the substrate. In contrast, the present invention specifically directs at least substantially all of the useful gas species, that is, those from the active region, onto the substrate. This effect is further enhanced by supplying incoming fresh gas directly to the active region and then directing it towards the substrate.

The guide allows the width of the plasma (that is, its lateral dimension) to be greater than that of the substrate. The difference between the width of the plasma and the substrate defines an "outer region" of the plasma. The guide directs the species from at least this outer region onto the substrate. The advantage of this is that, because of the skin effect (in the case of electromagnetic generation) or plasma sheath effects (in the case of powered electrodes), the majority of the energy from the plasma generator couples to the plasma in a peripheral "active" region. In practice this region ordinarily extends inwards from the periphery of the plasma by a few centimeters. It is therefore desirable to direct the species from the most active region (where their concentration is highest), directly onto the substrate by the use of the guide. The nature of the active species may change in transit from the active region to the substrate: either original or derived species may have useful effects on the substrate. The term "species" herein is intended to comprise the original and/or the derived species.

The width of the plasma is defined by the form of the plasma generation device and the volume within which the corresponding precursor gas(es) is contained. Depending upon the relative width of this region with respect to the substrate, the active region can be either fully or partially contained within the outer region mentioned above. With a cylindrical chamber, and a circular substrate surface, typically the active region is approximately toroidal.

The guide is therefore, according to one embodiment, adapted to direct towards (onto) the substrate at least the species generated substantially at or adjacent the periphery of the plasma, that is, at least in the active region mentioned above.

The substrate is typically spaced apart from the active region of the plasma and may be positioned within the upper part of the chamber, close to the active plasma, or further away in the lower part of the chamber. For example it may be positioned within a sub-chamber or within a dedicated chamber. In either case, the part of the chamber separating the substrate from the plasma generating region may be narrower in width than the region within which the plasma is generated. In this case, the chamber walls themselves may comprise the guide. This is quite different to many prior art systems in which the plasma generation region of the chamber is substantially narrower in width with respect to other parts of the chamber.

The guide may take a number of other forms, for example as a funnel. According to one embodiment, the guide is substantially a hollow conical frustum in shape. In such a case it typically has a linear cross-section upon either side of its central axis. In alternative forms, a curved section may be provided. Furthermore, the guide may be part linear and part curved in section.

Typically the guide is arranged with respect to the substrate such that the gas flow adopts a symmetrical flow over the substrate surface. However, the guide may be adapted to cause a net flow of the species across the substrate by either providing asymmetry within the guide itself or by positioning the guide asymmetrically with respect to the substrate. This avoids the possibility of producing a "stagnation point" of low reactivity at the center of the substrate.

The guide is typically positioned directly between the region in which the plasma is generated and the substrate. This provides an additional advantage in that the guide may be adapted to shield the substrate from electro-magnetic radiation originating from the plasma. This shielding according to one embodiment, includes reducing the amount of substrate having a direct line of sight with the active regions of the plasma, and also in preventing radiant heat impinging upon the substrate from the hottest parts of the chamber.

As is known, plasmas may comprise various kinds of active species, including ions, electrons and reactive neutral entities. In some cases it is desirable to prevent charged species from reaching the substrate surface and in such situations, in one embodiment, the guide further comprises a plasma termination device, which is operative to attenuate the supply of electrically charged species to the substrate. This may be achieved by the use of a conducting mesh as part of the guide device through which the gas flow passes. Alternatively or additionally, a magnet system may be used so as to divert the flow of electrically charged species.

Conveniently, the guide may also be provided in a from such that it is releasably coupled to the apparatus so as to allow the use of different guides for different specific processes.

Contact of reactive species with various surfaces, such as those of the guide, may cause detrimental reaction with the surface in question and a reduction in the active species concentration. Therefore, one embodiment of the present invention, the material(s) chosen for at least the surfaces of the guide which contact the gas flow, is arranged so as to reduce any quenching effect of the active species. The experiments described herein were performed with aluminium guide components only. More aggressive chemistries would require either different materials for the guide and chamber (e.g. Alumina, glass or for metal components, Nickel), or different coatings (e.g. Alumina on metal, or anodised aluminium).

In one embodiment of the present invention, the detrimental effect of contact between the species and the guide can also be mitigated by the heating of the guide to a predetermined temperature and the apparatus further comprises a suitable heating system to effect this.

In some cases the guide may be arranged to have an external dimension which is just less than that of the chamber itself such that, during use, the guide undergoes thermal expansion and comes into thermal contact with the chamber. This is particularly advantageous with higher powered systems such that the temperature of the guide can be accurately controlled.

The guide may also be arranged such that an underside surface of the guide is provided to control the density of the plasma, for example so as to recompress it, as it flows substantially radially in a region adjacent the edge of the substrate.

The gas flow is established and controlled by a gas flow system which is adapted to supply the one or more gases to the chamber and to remove the gases and species from the chamber. Such a system may typically comprise one or more vacuum pumps, gas bottles, regulators and conduits. Typically the gas(es) are supplied to the chamber in the region at or adjacent that in which the plasma is generated and vented from the system on the opposite side of the substrate to this region.

In order to maximise the efficient use of the active region of the plasma, in one embodiment the apparatus further comprises a deflector device within the chamber for directing the gas(es) introduced into the chamber towards the most active region(s) of the plasma. This ensures the supply of the fresh gas to the regions, maximises the system efficiency and also maximises the concentration of the species generated.

The invention is not limited to any particular form of plasma generator and suitable examples of such generators include an induction coupled plasma generator, a microwave plasma generator or electrode-based (capacitive) plasma generator.

The substrate is supported within the gas flow using a suitable support. Examples of such supports include a table or platten upon which the substrate is positioned or a device to which the substrate is mounted and held in position. In one embodiment, the support (and therefore the substrate) is positioned within the chamber.

Alternatively, the substrate may be positioned in a separate chamber with the guide being positioned between the chamber in which the plasma is generated and the chamber in which the substrate is supported.

In order to provide further adaptability, the support, in one embodiment, is moveable with respect to the plasma generation region so as to provide the user with the facility of a controllable distance between the plasma and the substrate. The moveable nature of the support provides for the use of different plasma treatments. The guide may also be mounted to the support when in either the static or moveable form. This is particularly advantageous when used with a moveable support since this allows advantage to be taken of the increased species flux provided by a closer proximity to the active plasma region.

In order to further control the reaction of the species with the substrate, the apparatus may further comprises an electrical supply system which is adapted to supply an electrical potential difference to the support. Such a potential may be a DC signal but in one embodiment, it is an RF signal.

In one embodiment, during the performance of the method in accordance with the second aspect of the invention, this electrical potential is provided to the substrate via the support so as to control the interaction of the species with the substrate.

In one example an induction coupled plasma is used in association with a low pressure process, where the pressure of the gas(es) within the chamber is between about 1 and 15 Pascals. A number of different types of precursor plasma gases may be used (including mixtures thereof) examples including $SF_6$ Chlorine, Fluouro-carbon compounds (e.g. CF4, C4F8 etc) nitrogen, oxygen and Silane.

The method may therefore be used in any suitable plasma treatment, such treatments typically including etching treatments and deposition treatments.

An example plasma treatment apparatus and method according to the present invention will now be described with reference to the accompanying drawings, in which:

BRIEF DESCRIPTION OF THE DRAWINGS

FIG. 8 is a graph illustrating the effect of reactive material density using different guides.

DETAILED DESCRIPTION

Figure 1:
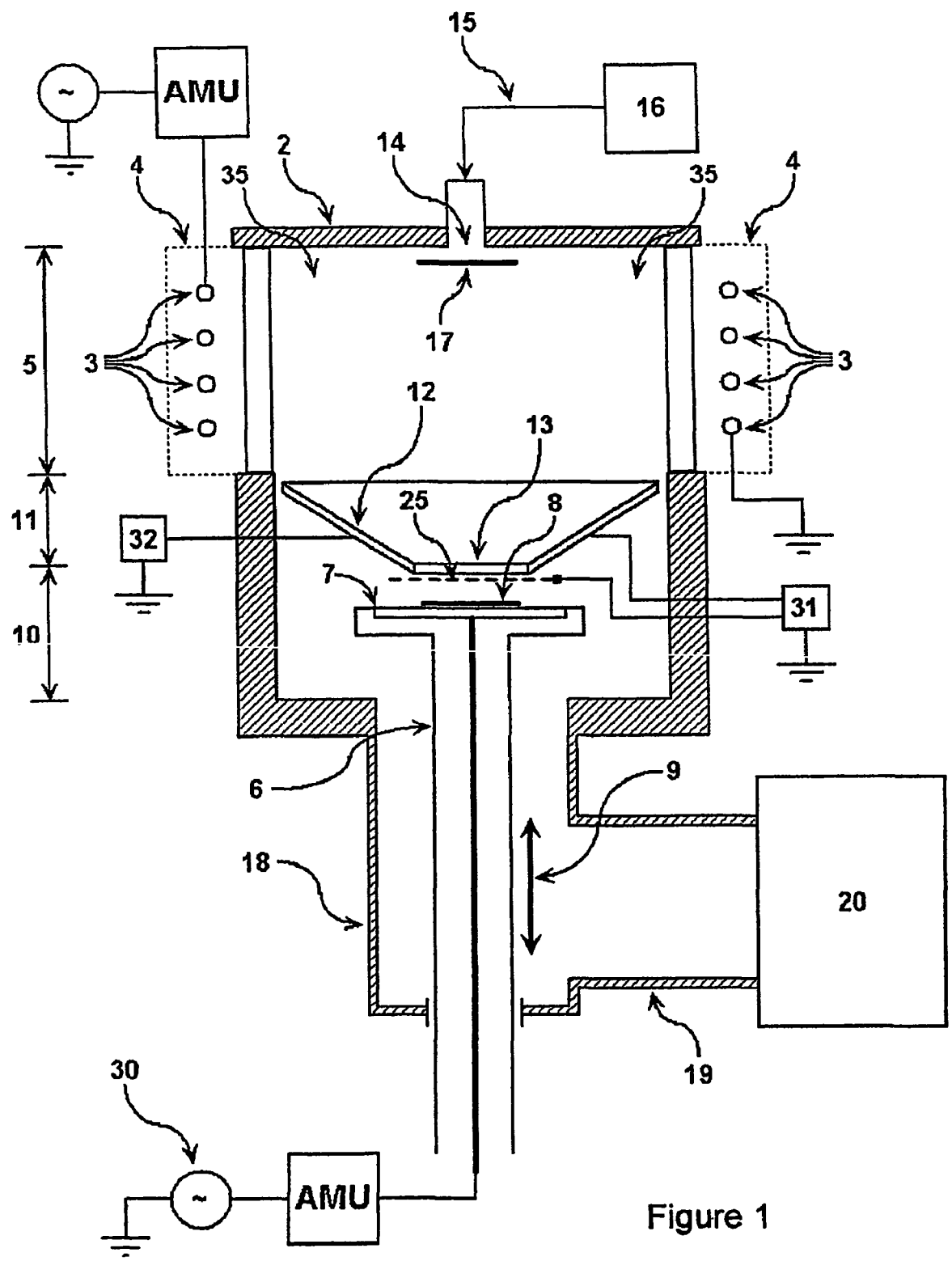
FIG. 1 shows a side view, partly in section, of apparatus according to the example.

Plasma treatment apparatus according to the example of the invention is shown in FIG. 1. The apparatus comprises a chamber 2 in the form of a cylinder, the cylinder in this case being vertically oriented along its axis and with the diameter of the chamber being about 380 millimeters. A series of induction coils 3 are provided surrounding the upper part of the chamber, the coils forming part of an induction coupled plasma generator 4. The position of the plasma generator 4 around the upper part of the chamber defines a plasma generation region S. A substrate support 6 is provided in a lower part of the chamber, this taking the form of a circular table arranged symmetrically about the cylinder axis and having an upper surface 7 upon which a substrate 8 is placed when in use.

The substrate holder 6 is arranged to be moveable axially as indicated at 9 by the provision of a screw thread.

The substrate support 6 is provided in the lower region of the chamber defining a substrate region generally indicated at 10.

An intermediate region 11 separates the upper plasma generation region 5 and the lower substrate region 10. A frusto-conical guide 12 is positioned within this intermediate region 11. This is arranged effectively as a funnel with the broader funnel "mouth" being provided at the top, adjacent the plasma generation region 5, and facing towards it. As can be seen in FIG. 1, the guide 12 is arranged such that an aperture 13 is provided in the lower part of the guide. This aperture is approximately the same diameter as that of the substrate 8 (which in this case is a circular substrate).

The upper mouth of the frusto-conical guide in turn has a diameter approximately equal to that of the chamber in the plasma generation region 5.

A gas inlet 14 is provided in the center at the top of the chamber 2. One of more precursor gases (from which the plasma is generated) are supplied along a conduit 15 from a gas supply 16, the conduit and gas supply forming part of a gas flow system for the apparatus.

Beneath the inlet 14 within the chamber, a deflector 17 is positioned centrally so as to deflect the gas(es) entering the chamber towards the chamber periphery.

The chamber is exhausted through an outlet 18 positioned at one side of the chamber base. An exhaust conduit 19 and corresponding vacuum pumps (turbo-molecular and rotary pumps) 20 are provided to achieve this, these components also forming part of the gas flow system for the apparatus.

Optionally, a conductive mesh or magnet system may be provided as part of or adjacent to the guide 12, these being indicated schematically at 25. Such devices may be used where it is desirable to terminate the plasma at the edge of the plasma generation region 5, these devices therefore acting as a plasma terminating device. An electrical supply 31 is also provided so as to power such a device where necessary. An additional electrical supply 30 is connected to the substrate support 6 so as to provide an RF bias to the substrate 8. This allows further control of the interaction of the species with the substrate as mentioned earlier. As indicated in FIG. 1, a further electrical supply 32 may also be connected to the guide 12 when the guide also comprises a heating device, so as to heat the guide during use to a temperature of between about 100 and 200° C.

This could be an active heating system whereby external electrical power is used to heat the guide components as is done for the chamber. In one embodiment, the plasma is used to provide the heating for the guide 12 components. We have determined that, for a unit constructed from thin sheet metal, the plasma heating effect can be significant and rapid, achieving in excess of 300_C at 3 kW over a period of ten minutes or so. We have also determined that a unit designed for higher powers can exploit thermal expansion to control the temperature of the unit. If the guide section is constructed with an external diameter just less than that of the chamber 2 (for example, 1 or 2 mm), it is found that initially the temperature rise is relatively rapid given that the guide 12 has little or no thermal contact with the temperature controlled surface that is the chamber wall. As the unit heats up it will expand until it achieves a dimension sufficient to provide a good thermal contact with the wall of the chamber. Experiment has shown this to be at a temperature in excess of 250_C. This provides a good thermal contact with the temperature-controlled wall, which then controls the temperature of the guide unit by providing a heat path to the heat sink that is the chamber wall. In this way a relatively simple construction is envisaged whereby initial heating may be performed during a heating stage with the wafer absent from the chamber but with the plasma running. Once a reasonable temperature has been achieved then the process can be performed on the wafer. Provided the guide section is of sufficient mass, the temperature decay will be minimal for periods of several tens of minutes as the wafer is loaded for the process stage.

It should be noted that at low JCP Power there might be insufficient heating to maintain a suitable temperature. We envisage the lighter material unit to be used in this instance. In this case, the unit is, in one embodiment, designed and implemented with a poor thermal contact to the temperature-controlled object (chamber). Temperature rise would be rapid until it came into equilibrium with radiative and convective heat loss mechanisms. For such a unit running at high power, and for a more robust unit running at very high power, it is preferable that the guide incorporate additional cooling, which might take the form of a cooling fluid flowing in grooves machined into the under-side of the guide, fluid passages or channels, or fluid-containing pipes attached to the non-plasma facing surface of the guide by either welding or some form of compression device.

The operation of the apparatus is now described with reference to FIGS. 2 and 3 from the point of view of an amount of gas flowing through the apparatus during use. It will be appreciated, that despite the steps described below, the method is effectively steady state during operation. Prior to these steps, the substrate is loaded into the chamber, the chamber is evacuated and the gas flow at the predetermined pressure is established.

Figure 2:
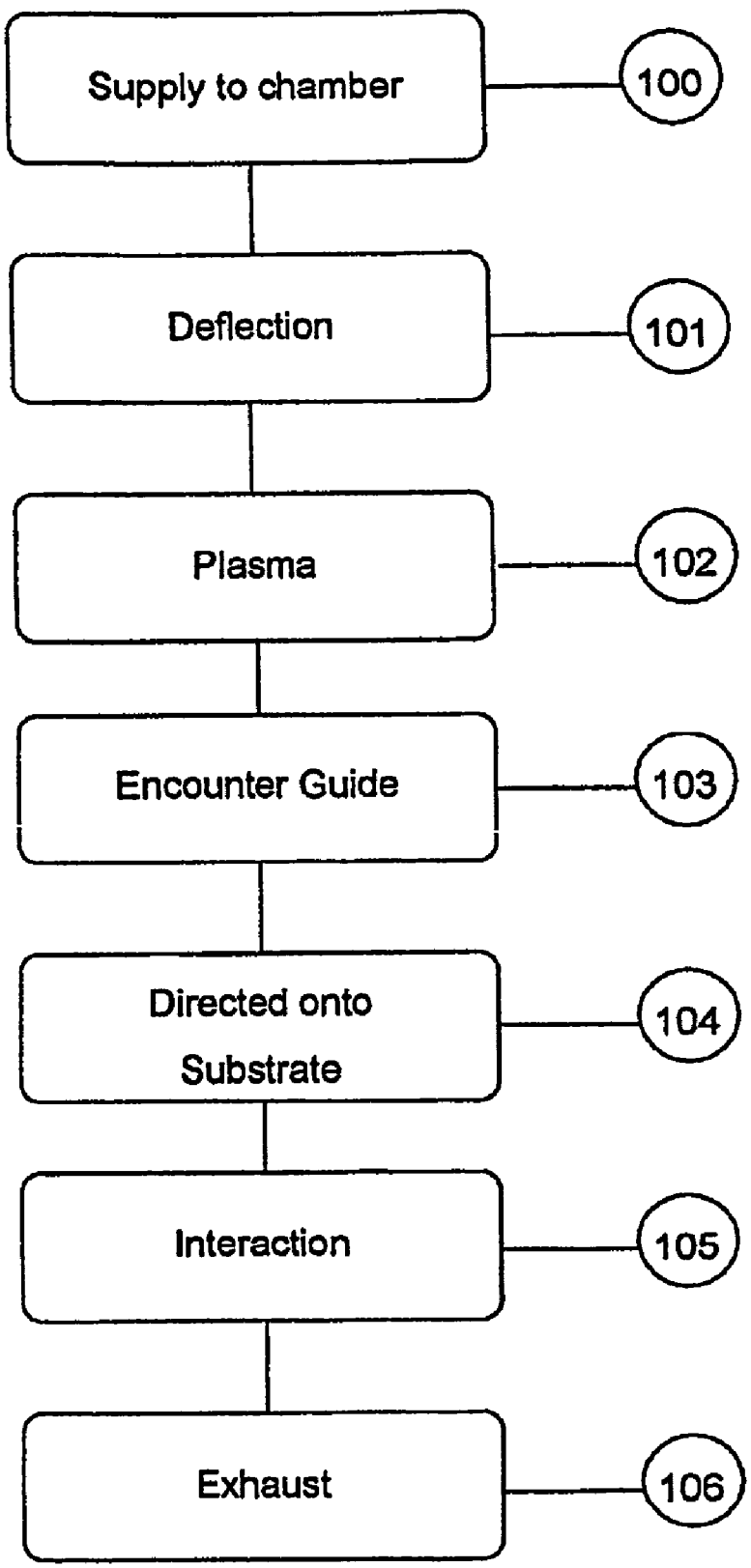
FIG. 2 is a flow diagram of the method.
Figure 3:
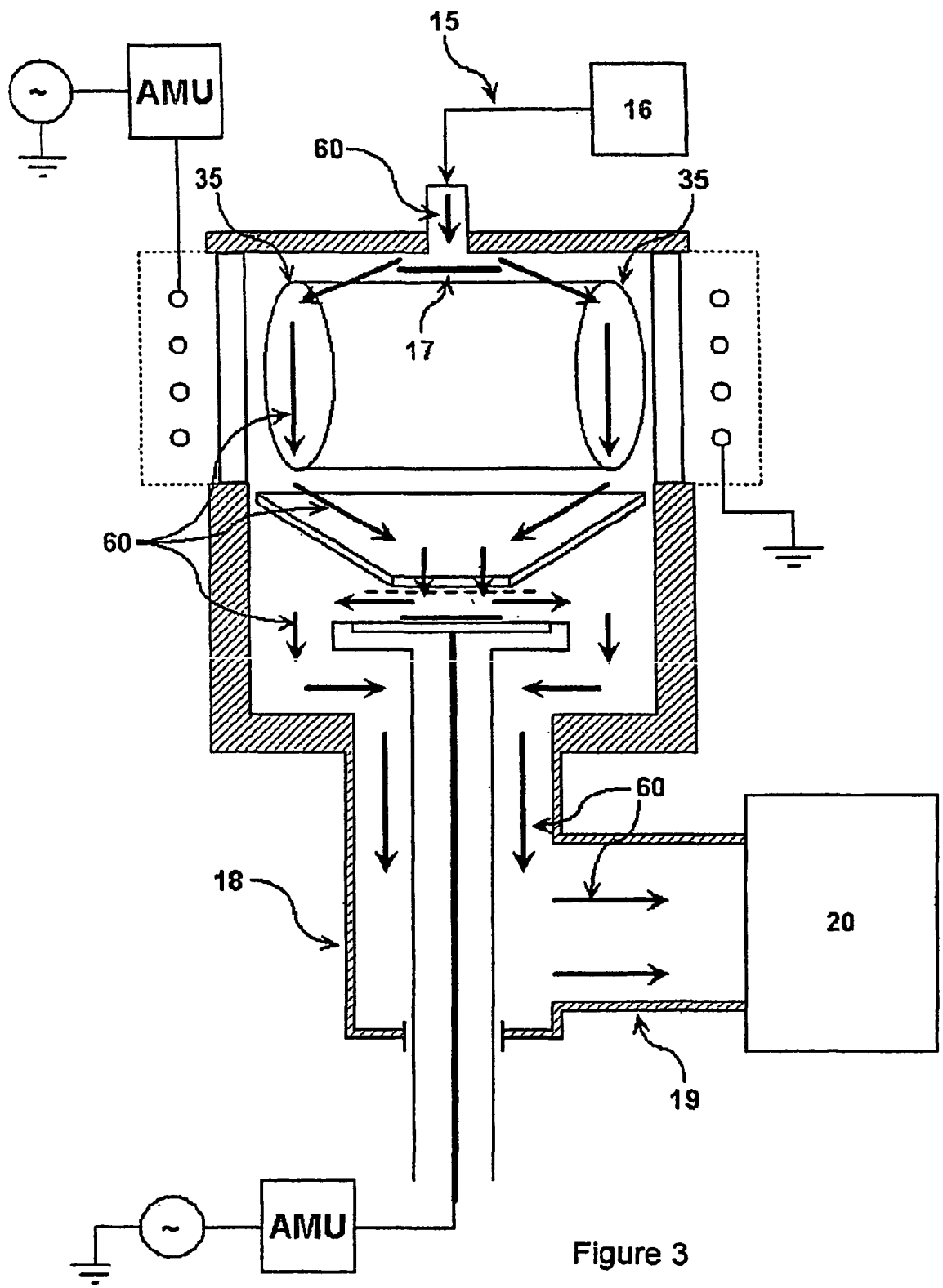
FIG. 3 shows the gas flow within the apparatus.

Referring to FIG. 2, the gas in question firstly leaves the gas supply 16 and passes down the conduit 15 before entering the chamber via the inlet 14 at step 100. The gas flow is indicated schematically by the arrows 60 in FIG. 3. In the present example the gas is sulphur hexafluoride ($SF_6$).

Figure 4:
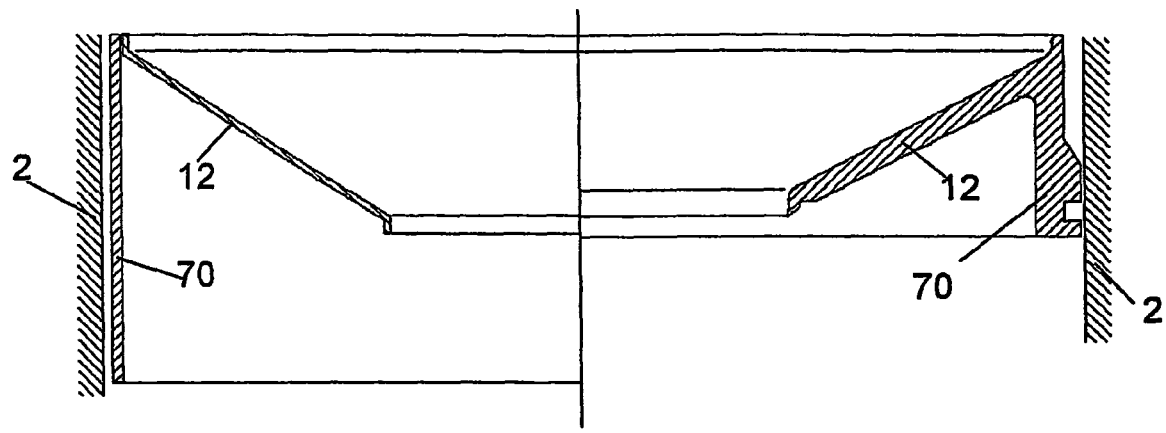
FIG. 4 illustrates example guides for low and medium power systems.

FIG. 4 shows, on the left, a low power version of the guide (including a support framework 70) and, on the right a medium power version.

At step 101 the gas entering the chamber is deflected outwards towards the side walls of the chamber by the deflector 17. A plasma is present within the chamber due to the stimulation of the gas within the region 5 by the plasma generator 4. In the system illustrated in FIG. 1, the maximum energy is imparted within a roughly toroidal region indicated at 35. It will be noted that the gas is deflected into this region by the deflector 17.

At step 102, the gas approaches and enters the toroidal region 35. Here the energy provided by the plasma generator 4 is at a maximum and this readily causes the newly arrived gas to dissociate into plasma species. Various highly reactive species are formed as a result within the gaseous phase and subsequently, these species are carried downwards by the gas flow until they are redirected by the guide 12 at step 103.

At this stage, if a plasma termination device 25 is present, any charged species are either deflected or neutralised at the plasma termination device 25, incorporated into the guide 12.

At step 104, the gas exits the aperture 13 and impinges upon the upper surface of the substrate 8. Interaction of the substrate surface with the species contained within the gas then occurs at this stage (step 105), so as to produce etching, deposition or modification, depending upon the parameters and gases used.

If an electrical bias is applied to the surface of the substrate during this process then this bias has a short-range effect and modifies the energy of the charged species striking the surface. The deposition or etching effect is therefore influenced accordingly.

At step 106 the gas then flows over the outer edge of the substrate and downwards to be exhausted from the chamber via the outlet 18, exhaust conduit 19 and vacuum pumps 20.

In order to test the efficacy of the apparatus and method described above, experiments were performed with a pure $SF_6$, silicon etching process on blank 100 millimeter diameter silicon wafers, these each acting as the substrate 8. A plasma source with a diameter of 380 millimeters was used (this being the diameter of the chamber 2). A 100 millimeter electrostatic wafer holder was used as a substrate support 6. An induction coupled plasma generator was used with a power of 5 kW operating at 2 MHz. In addition, an RF potential was applied to the substrate via the substrate support, this having a power of 25 Watts and operating at 13.56 MHz. The $SF_6$ pressure in the chamber was 35 millitorr (4.66 Pascals) with a flow rate of 500 sccm (standard cubic centimeters per minute, as is well known within the art).

Experiments were performed in identical apparatus with and without the use of the frusto-conical guide 12. In the apparatus without the guide, the gas flow was not re-directed onto the substrate surface, and a significant proportion of the species generated in the plasma generating region would pass by the substrate holder and not interact with the substrate. In the apparatus fitted with the guide, all of the species generated in the plasma generation region and contained within the gas flow would be re-directed onto the substrate surface.

The measured etch rates were found to be as follows:

Standard ICP380 ("Control"): 6.73 µm/min

With the guide in place: 13.52 µm/min

The use of the guide 12 doubled the observed etch rate in these experiments. The etch uniformity was also investigated in the apparatus with the guide and found to be ±2.3%. and well within the requirements of industrial practice.

The effectiveness of the grid (plasma termination device 25) in the mitigation of the ionic content of the plasma in contact with the wafer being processed has been demonstrated during development work. If ions are present, they show their presence by accelerated erosion of the material used to provide the pattern to be etched on the wafer, the mask. Measuring the rate of erosion of the mask relative to the material it is intended to etch (e.g. Silicon) will give a measure of the control over the ionic composition of the plasma with and without the grid mounted as shown in FIG. 1 (item 25). In this particular case the grid was mounted so that it was in electrical contact with the guide and thus at the same electrical potential as the guide.

A higher ionic content will erode the mask material more quickly thereby reducing the selectivity of the etch process, measured as the ratio of the etch rate of the Experiments indicate that without the grid, the selectivity (Si:Mask (Photoresist)) was 58:1, whereas with the grid this figure increased to 107:1, an improvement of about 1.9 indicating that the mask lasts 1.9 times longer with the grid in place than without, and hence that the ion content of the plasma has been significantly reduced.

Figure 5:
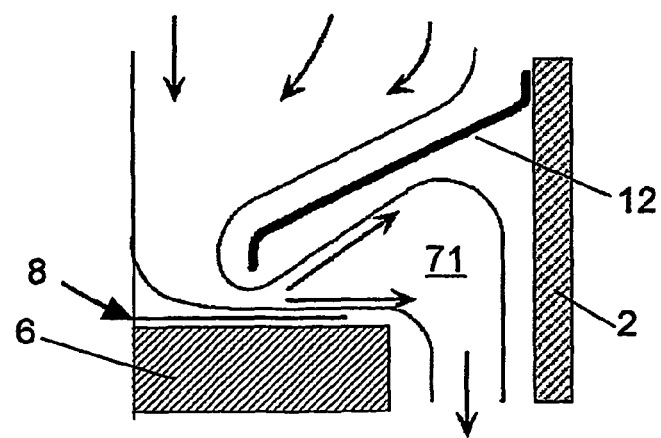
FIG. 5 shows gas expansion as it passes under the guide edge.
Figure 6:
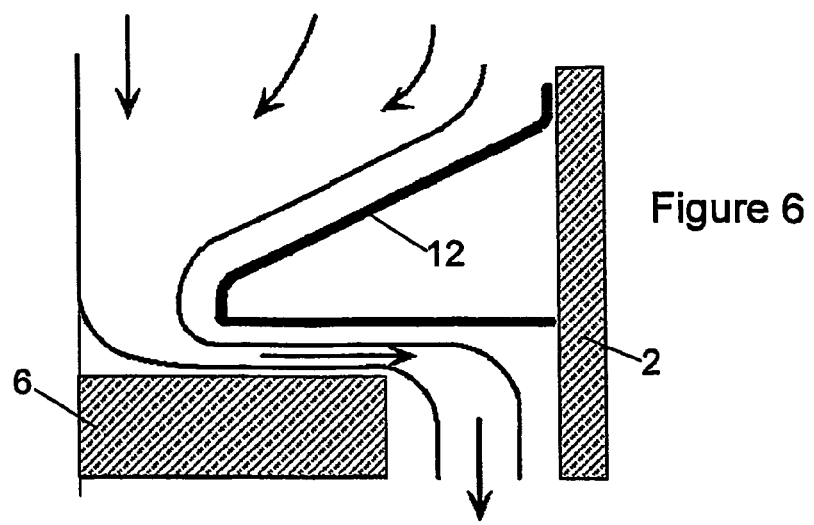
FIG. 6 shows the gas flow for a guide with parallel underside.
Figure 7:
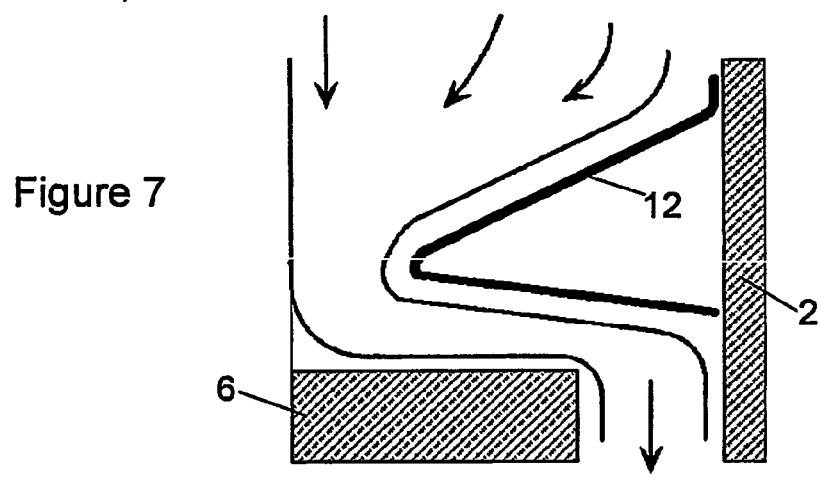
FIG. 7 shows the gas flow for a guide with a downwardly sloped underside.

Uniformity of process is an important issue to be addressed. For a substrate wafer of a diameter larger than the throat of the guide it is possible for the neutral density to drop as a result of the expansion of process gases downstream of the guide throat. As the material flows down through the guide from the plasma source it is compressed during its transit through the gap between the guide throat and the table. Once past this point the material expands as both radius increases and in the axial direction away from the table surface. This is illustrated at 71 in FIG. 5. There is as associated reduction in the density of reactive material in contact with the edge of a wafer located at a radius greater than that of the throat, which produces non-uniformity in the process. If the gap behind the guide is filled so that the underside of the guide is parallel with the surface of the table then the axial expansion is prevented (FIG. 6). To compensate for the expansion of gases as radius increases the underside of the guide is, in one embodiment, sloped such that the gap diminishes as radius increases (see FIG. 7). This has the effect of recompressing the gas flow as it travels outwards across the wafer and table toward the periphery of the chamber and thence to the pumping port.

Simulations demonstrate that the neutral density can be sustained across the table surface. They show that a flat underside to the guide has the effect of changing the rate of decrease of the density of material in close contact with the wafer beyond the throat dimension (0.0675 m in this example). This can be seen by comparing curve D with curve C in FIG. 8. There is also an associated increase in the overall density because of the restrictive effect such a design will have on the flow of gas. This factor is increased with the sloping underside (B) and is further exacerbated when the flat surface area of the table is increased (A). The optimum position will be that which balances the benefit of compression against the limitations imposed upon the system pumping speed, which will also diminish as the gap is reduced.

These experiments therefore indicate that the apparatus and method according to the present invention provides a significant improvement in the plasma treatment of substrates.

The invention claimed is:

1. Apparatus for plasma treating a substrate comprising: a chamber; a gas flow system configured to cause a flow of at least one gas within said chamber and to remove said gas from said chamber; a plasma generator for causing the at least one gas within the chamber to form a plasma, said plasma generator comprising an induction coupled plasma source having an RF coil encircling said chamber, thereby generating at least one species said plasma being generated in a plasma generation region extending between a wall of said chamber which is proximal to said RF coil, and a first width which is distal from said RF coil; and a detachable guide for directing the gas flow containing the species towards said substrate to be treated, said guide defining a path through which said at least one gas and said at least one species flow from said plasma generating region to said substrate;

said guide having an entrance and an exit, said entrance having a second width and being disposed proximal to said plasma generating region, said exit having a third width and being disposed proximal to said substrate to be treated;

said second width being greater than said first width, and said third width is less than said first width, said guide being configured such that at least one gas is directed toward said substrate to be treated.

2. Apparatus according to claim 1, wherein the guide is adapted to direct towards the substrate at least the species generated substantially at or adjacent the periphery of the plasma.

3. Apparatus according claim 1, further comprising a gas inlet for supplying said at least one gas into said chamber and a deflector device within the chamber for directing the at least one gas introduced into the chamber towards at least one most active region of the plasma.

4. Apparatus according to claim 1, wherein at least part of the guide is substantially curved in section.

5. Apparatus according to claim 1, wherein the guide is provided with asymmetrical walls between said entrance and exit and wherein said center of said guide is disposed asymmetrically with respect to said substrate, resulting in a bulk flow of said at least one species across the substrate.

6. Apparatus according to claim 1, wherein the guide is disposed to prevent line of sight between said substrate to be treated and said plasma generating region so as to shield the substrate from electromagnetic radiation originating from the plasma.

7. Apparatus according to claim 1, wherein an internal surface of said guide between said entrance and said exit is configured to prevent quenching of active species within said flow of at least one gas.

8. Apparatus according to claim 1, further comprising a guide heating system arranged to heat the guide to a predetermined temperature when in use.

9. Apparatus according to claim 1, wherein the guide is formed from the chamber walls.

10. Apparatus according to claim 1, wherein the guide has an external dimension just less than that of the chamber such that, during use the guide undergoes thermal expansion and comes into thermal contact with the chamber.

11. Apparatus according to claim 1, wherein the guide further comprises an underside surface arranged to recompress the plasma as it flows substantially radially in a region adjacent the edge of the substrate.

12. Apparatus according to any of claim 1, wherein the guide is substantially linear in section.

13. Apparatus according to claim 12, wherein the guide is substantially a hollow conical frustum.

14. Apparatus according to claim 1, wherein the guide further comprises a plasma termination device disposed between said plasma generating region and said substrate so as to attenuate the supply of electrically charged species to the substrate.

15. Apparatus according to claim 14, wherein the plasma termination device is an electrically conducting mesh.

16. Apparatus according to claim 15, further comprising an electrical power supply for powering the electrically conducting mesh.

17. The apparatus according to claim 16, wherein the plasma termination device comprises an electrically conductive grid mesh mounted to the guide and through which the gas flow passes when travelling between the entrance opening and exit opening of the guide.

18. Apparatus according to claim 14, wherein the plasma termination device is a magnet.

19. Apparatus according to claim 1, further comprising a support for supporting the substrate.

20. Apparatus according to claim 19, wherein the support is located within the chamber.

21. Apparatus according to claim 19, wherein the support is moveable so as to provide a variable distance between the plasma and the substrate.

22. Apparatus according to claim 19, wherein the guide is mounted to the support.

23. Apparatus according to claim 19, further comprising an electrical supply system adapted to supply electrical power to the support.

24. A method for plasma treating a substrate comprising: causing at least one gas to flow within a chamber; forming a plasma from the at least one gas within the chamber using a plasma generator said plasma generator comprising an induction coupled plasma source having an RF coil encircling said chamber, directing the at least one gas introduced into the chamber towards the most active region (s) of the plasma, said most active region of said plasma is an outer region, wherein said outer region encloses an inner region, and wherein more of said at least one gas entering the chamber is directed to said outer region rather than said inner region, thereby generating at least one species; and directing the gas flow containing the species towards the substrate with a guide having a opening proximate to said plasma generating region having a diameter greater than that of an opposing opening proximate to said substrate; wherein the width of the plasma in use is greater than that of the substrate, the difference between the widths defining said outer region of plasma proximal to a wall of said chamber encircled by said RF coil, and wherein the species are directed from substantially all of the outer region, towards the substrate.

25. A method according to claim 24, wherein the gas pressure within the chamber is in the range 1 to 15 Pa.

26. A method according to claim 24, wherein the at least one gas comprises at least one gas selected from the group of gases consisting of SF6, chlorine, fluorocarbon compounds, nitrogen, oxygen silane and combinations thereof.

27. A method according to claim 24, wherein the power input of the plasma generator is about 5 kW.

28. A method according to claim 24, wherein the gas flow rate is about 500 standard cubic centimeters per minute.

29. A method according to claim 24, wherein the plasma treatment comprises an etching treatment.

30. A method according to claim 24, wherein the plasma treatment comprises a deposition treatment.

31. A method according to claim 24, wherein at least the species generated substantially at or adjacent the periphery of the plasma are guided onto the substrate.

32. A method according to claim 24, further comprising causing a flow of the species across the substrate.

33. A method according to claim 24, wherein an electrical power is provided to the substrate so as to control the interaction of the species with the substrate.

34. A method according to claim 33, wherein the electrical potential is an RF potential.

* * * * *